United States Patent
Neumeuer et al.

(10) Patent No.: US 7,233,027 B2
(45) Date of Patent: Jun. 19, 2007

(54) ARRANGEMENT COMPRISING AT LEAST TWO DIFFERENT ELECTRONIC SEMICONDUCTOR CIRCUITS

(75) Inventors: Dag Neumeuer, München (DE); Martin Brahms, Rodenberg (DE)

(73) Assignee: Merge Optics GmbH, Berlin (DE)

( * ) Notice: Subject to any disclaimer, the term of this patent is extended or adjusted under 35 U.S.C. 154(b) by 0 days.

(21) Appl. No.: 10/476,341

(22) PCT Filed: Apr. 17, 2002

(86) PCT No.: PCT/EP02/04226
§ 371 (c)(1),
(2), (4) Date: May 24, 2004

(87) PCT Pub. No.: WO02/089208
PCT Pub. Date: Nov. 7, 2002

(65) Prior Publication Data
US 2004/0195680 A1 Oct. 7, 2004

(30) Foreign Application Priority Data
Apr. 30, 2001 (DE) ................. 101 21 422
Sep. 8, 2001 (DE) ................. 101 44 207

(51) Int. Cl.
*H01L 33/00* (2006.01)
(52) U.S. Cl. .................. 257/98; 257/116; 257/118; 257/252; 257/432; 257/E31.127
(58) Field of Classification Search .................. 257/98, 257/116–118, 252, 432, E31.127
See application file for complete search history.

(56) References Cited

U.S. PATENT DOCUMENTS

| | | | | |
|---|---|---|---|---|
| 4,767,174 A | * | 8/1988 | Carenco et al. | 385/97 |
| 4,778,244 A | | 10/1988 | Ryan | |
| 4,945,400 A | * | 7/1990 | Blonder et al. | 257/116 |
| 5,522,004 A | | 5/1996 | Djupsjöbacka et al. | |
| 6,100,595 A | * | 8/2000 | Jaouen et al. | 257/778 |
| 6,117,794 A | * | 9/2000 | Dormer et al. | 438/745 |

(Continued)

FOREIGN PATENT DOCUMENTS

DE 34 09 146 9/1985

(Continued)

*Primary Examiner*—Kenneth Parker
*Assistant Examiner*—Jesse Fenty
(74) *Attorney, Agent, or Firm*—Alfred A. Fressola; Ware, Fressola, Van Der Sluys & Adolphson LLP

(57) ABSTRACT

The invention relates to an arrangement comprising at least two different electronic semiconductor circuits (HS) in which each of the semiconductor circuits (HS) is a component made of semiconductor material and which has an electrically active surface and electronic contacts, and corresponding contacts of the semiconductor circuits are connected to one another in an electrically conductive manner. In order to simplify production, the semiconductor circuits (HS) are produced in a common support (12) made of semiconductor material and are connected to one another in an electrically conductive manner. Electrically conductive contacts (18) that are connected to the semiconductor circuits (HS) are produced on the surface of the support (12) by metallizing the support. Said support (12) has an expansion (13), which is made of the same material, forming a unit with the same, and which is provided for accommodating additional switching elements or components.

16 Claims, 2 Drawing Sheets

U.S. PATENT DOCUMENTS

| | | | |
|---|---|---|---|
| 6,132,107 | A | 10/2000 | Morikawa |
| 6,141,471 | A * | 10/2000 | Agatsuma ................... 385/49 |
| 6,200,531 | B1 * | 3/2001 | Liljestrand et al. .......... 422/52 |
| 6,275,516 | B1 * | 8/2001 | Arney et al. .................. 372/71 |
| 6,490,392 | B1 * | 12/2002 | Munekata et al. ............ 385/31 |
| 6,627,096 | B2 * | 9/2003 | Sherrer et al. ................ 216/24 |
| 2002/0054615 | A1 * | 5/2002 | Nagamatsu et al. .......... 372/36 |
| 2002/0110328 | A1 * | 8/2002 | Bischel et al. ................ 385/49 |
| 2002/0122454 | A1 * | 9/2002 | Nasu et al. .................. 372/102 |
| 2003/0015768 | A1 * | 1/2003 | Bosco et al. ................ 257/528 |

FOREIGN PATENT DOCUMENTS

| | | | |
|---|---|---|---|
| DE | 43 10 170 | 10/1994 | |
| EP | 0 987 769 | 3/2000 | |
| EP | 0 987 769 A2 * | 3/2000 | ................ 257/98 |

* cited by examiner

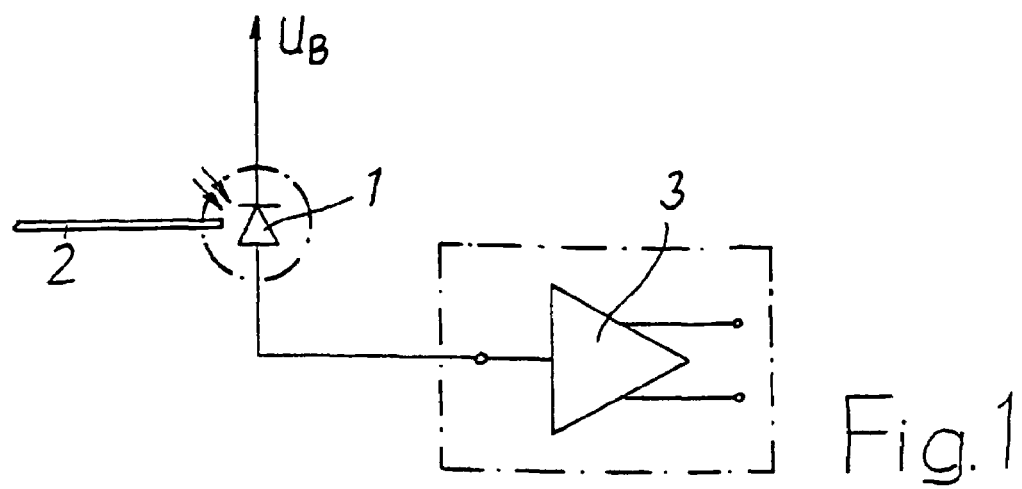
Fig. 1
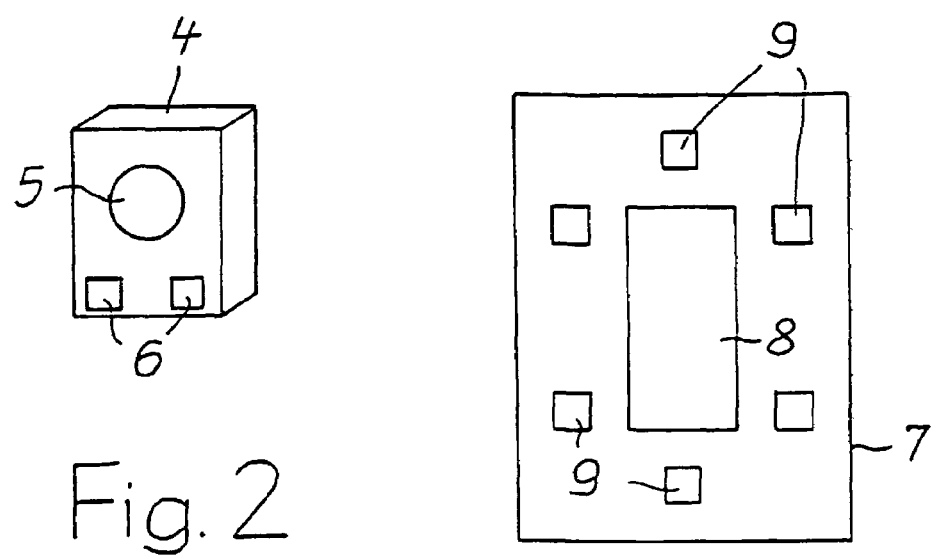
Fig. 2
Fig. 3
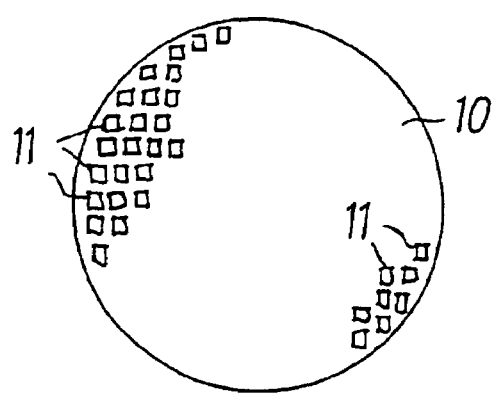
Fig. 4

ARRANGEMENT COMPRISING AT LEAST TWO DIFFERENT ELECTRONIC SEMICONDUCTOR CIRCUITS

CROSS REFERENCE TO RELATED APPLICATIONS

This application is for entry into the U.S. national phase under §371 for International Application No. PCT/EP02/04226 having an international filing date of Apr. 17, 2002, and from which priority is claimed under all applicable sections of Title 35 of the United States Code including, but not limited to, Sections 120, 363 and 365(c), and which in turn claims priority under 35 USC §119 to German Patent Application Nos. DE 101 44 207.6 filed on Sep. 8, 2001, and DE 101 21 422.7 filed on Apr. 30, 2001.

TECHNICAL FIELD

The invention concerns an arrangement with at least two different electronic semiconductor circuits, in which each of the semiconductor circuits is a component made of semiconductor material, which has an electrically active surface and electrical contacts, and wherein corresponding contacts of the semiconductor circuits are interconnected in an electrically conductive manner (DE 34 09 146 A1).

BACKGROUND OF THE INVENTION

Such an arrangement is needed for example for data transmission via glass fibers or optical fibers. The semiconductor circuits arrangement can be designed to be the receiver or the sender. A receiver comprises for example a photodiode and a transimpedance amplifier which acts as a preamplifier. The semiconductor circuits in a sender can be a laser diode and a driver circuit. Since the difficulty of constructing corresponding arrangements is about the same in all cases, the following considers a receiver of optical signals comprising semiconductor circuits and is representative of all other applications.

In the technology of today electronic semiconductor circuits are produced on so-called wafers. These are relatively thin disks that are cut from a block of suitable semiconductor material. Suitable semiconductor materials are for example silicon, gallium-arsenide and indium-phosphide. Special processes are used to produce a very large number of semiconductor circuits on such wafers, which are generally identical. In addition to the active (semiconductor circuit) surfaces constructed in this manner, electrical contacts are also produced, which are connected to the active surfaces and are used for example to electrically connect corresponding semiconductor circuits to a leadframe, to a supporting substrate or to a supporting circuit board. To that end the well-known technology uses wires made of a material that has good electrical conductivity, for example gold or aluminum, which are connected to the contacts of two semiconductor circuits for example by means of electrically conductive bonding (DE 43 10 170 A1). During a fast data transmission at frequencies in the GHz range, such wires may cause interference and thereby create signal distortions which can lead to unusable i.e. non-interpretable signals.

The above mentioned DE 34 09 146 A1 describes an arrangement described as an opto-electronic module wherein at least one amplifier element is integrated on a substrate made of semiconductor material such as silicon for example. The substrate has an opening into which a light modulator, such as a solid-state laser for example, is inserted. It is cemented for example to the substrate in the opening. A bonding wire connects the light modulator to an amplifier element of the substrate in an electrically conductive manner. The production of this known arrangement is expensive. It can only be used with vertical light incidence. As mentioned above the bonding wire may cause interference, particularly at very high data rates.

SUMMARY OF THE INVENTION

The object of the invention is to construct the above mentioned arrangement so that it is simple to produce and ensures a data transmission which is free of interference even at the highest transmission speeds. The invention achieves this object in that:
  the semiconductor circuits are constructed in a common support made of semiconductor material and are interconnected in an electrically conductive manner;
  electrically conductive contacts are created on the surface of the support by means of metallization; they are connected to the semiconductor circuits, and
  the support contains an expansion which is made of the same material and forms a unit with it for receiving other circuit elements or components.

This arrangement enables maximum utilization of a support made of a homogeneous material, so that for example all of the elements needed for transmitting data via glass fibers by a sender and/or receiver of optical signals are present and interconnected as semiconductor circuits in a one-piece unit. Thus in addition to sender and receiver diodes and amplifiers, other semiconductor circuits which are necessary or useful for good data transmission quality can be produced in the common support. Such other semiconductor circuits are for example R-C (Resistance-Capacitance) elements and monitor diodes, or also microcontrollers for performing and controlling transmission sequences. The arrangement is furthermore nearly independent of the light incidence direction, since both the photodiode and the laser diode can be placed in different positions.

The expansion is made of the same material as the support and forms a unit with it; it offers the possibility of creating a V-groove in a simple manner by means of micromechanical structuring for example, so that an optical fiber can be placed therein. An optical fiber can then be very accurately located with respect to a photodiode or a laser diode on or in the expansion. Using micromechanical structuring also allows more than one V-groove to be created in the expansion, and to provide a base for installing other circuit elements or components which can then be connected in a very simple manner to the semiconductor circuits of the support. Such circuit elements or components are for example relays, lenses, mirror elements, optical filters, optical insulators, optical amplifiers and optical fibers which are used as connectors.

The arrangement also includes the possibility of subsequently installing one or even more than one semiconductor circuits on the support or its expansion in order to produce a complete circuit. This may be for example a separately produced photodiode or laser diode, which can be installed on the support so that its electrical contacts are directly positioned on corresponding surface contacts. In all embodiments the distances between the corresponding contacts of the individual semiconductor circuits are very short. The electrically conductive connections are therefore also very short. Thus they are unable to produce significant parasitic inductances or capacitances. Also they clearly produce fewer electromagnetic couplings in comparison with the well-known arrangements. Most of the disturbing effect which the electrically conductive connections between the semiconductor circuits exert on the data to be transmitted is thereby also avoided, even at very high frequencies, especially at frequencies above 1 GHz.

BRIEF DESCRIPTION OF THE DRAWINGS

Embodiments of the subject of the invention are illustrated in the drawings, wherein:

FIG. 1 is a schematic circuit for receiving optical signals.

FIGS. 2 and 3 are also two different schematic semiconductor circuits.

FIG. 4 is a top view of a wafer with a large number of semiconductor circuits.

DETAILED DESCRIPTION

Figure 5:
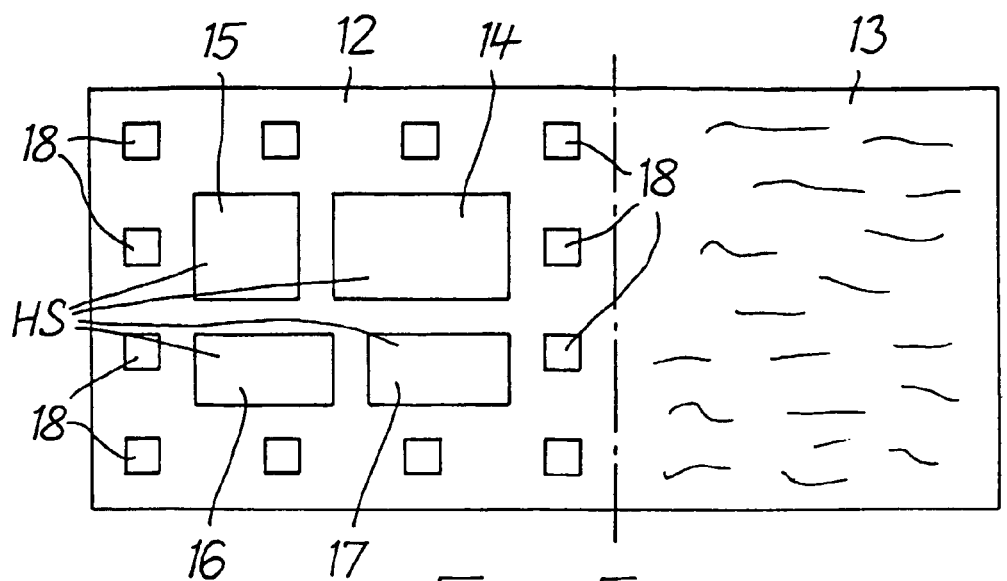
FIG. 5 is an arrangement according to the invention.

To better understand the arrangement of the invention FIGS. 1 to 4 first provide basic explanations of a receiver circuit of optical signals for the transmission of data via glass fibers or optical fibers.

The receiver circuit shown in FIG. 1 has a photodiode 1 as the actual light receiver, for example a PIN diode (P-Intrinsic-N) which receives light of a data stream that is transmitted via an optical fiber 2. The photodiode 1 operates as an opto-electrical transducer and is connected to an amplifier 3 of the electrical signals, which amplifies the signals delivered by the photodiode 1 into signals that can be processed further. A transimpedance amplifier is particularly well suited as the amplifier 3. The bias voltage required by the photodiode 1 is indicated by $U_B$. The photodiode 1 and amplifier 3 are semiconductor circuits. In that sense they are respectively outlined by broken lines in FIG. 1.

In conventional technology the photodiode 1 according to FIG. 2 comprises a support 4 made of semiconductor material, for example gallium-arsenide or indium-phosphide. A special process is used to produce an active surface 5 on the support 4. The photodiode 1 in the illustrated embodiment also has two electrical contacts 6 which are installed on the same surface of the support. The contacts 6 could also be installed on different surfaces of the support 4, for example on two surfaces which oppose each other. More than two contacts 6 can also be provided.

A support 7 for the amplifier 3 is schematically illustrated in FIG. 3 and is made for example of the same semiconductor material as the support 4. It has an active surface 8 which in this case includes an integrated circuit. The support 7 also has a greater number of contacts 9. Like the contacts 6 in photodiode 1, they can be made of copper, gold or aluminum for example.

As seen in FIG. 4, the semiconductor circuits for the photodiode 1 and amplifier 3 are produced on the wafers by using conventional technology. These are disks with a specified thickness of 500 μm for example of semiconductor material such as for example silicon, gallium-arsenide and also indium-phosphide. A very large number of semiconductor circuits 11 are simultaneously produced on a wafer 10. Here identical semiconductor circuits 11 are effectively produced on one wafer 10. In the end they are individually separated from the wafer 10 for further processing. The components needed for a complete circuit, in this case the photodiode 1 and the amplifier 3 for example, are then interconnected by their electrically conductive contacts.

As seen in FIG. 5, the arrangement according to the invention produces at least two different semiconductor circuits on a common semiconductor material support 12, and contains an expansion 13 made of the same material which is outlined by a broken line. In the embodiment of the arrangement illustrated in FIG. 5, the support 12 which is made of semiconductor material such as silicon, gallium-arsenide or also indium-phosphide, has four different semiconductor circuits HS. They were produced on a wafer 10 together with identically constructed or even other types of arrangements as explained for FIG. 4.

The semiconductor circuits HS in FIG. 5 belong for example to a receiver circuit for optical signals. They are a photodiode 14, an amplifier 15, an R-C element 16 and a microcontroller 17. Several electrically conductive contacts 18 are also located on the surface of the support 12 and are connected to the semiconductor circuits HS. If applicable, they are also used as electrically conductive connections to other useful components that are required or useful for an optimum data transmission, which are not integrated into the support 12.

The support 12 is equipped with the semiconductor circuits HS by means of the usual technology. The electrically conductive connections between them can be produced at the same time when the different semiconductor circuits 14 to 17 with individual active surfaces and contacts are being constructed. Finally the support 12 is metallized, which produces the contacts 18 connected to the pertinent semiconductor circuits HS and possibly also the connections between the semiconductor circuits 14 to 17. The completed receiver circuit of the support 12 only needs to be connected to at least one optical fiber (glass fiber), namely the photodiode 14. To complete a transmission system the support 12 can then be installed on a linkage support, for example a circuit board. Its contacts 18 establish the required electrically conductive connections.

For example if the photodiode 14 is not to be produced simultaneously with the other semiconductor circuits HS in the common support 12, it can very easily be installed as a separate component with a thickness of 100 μm to 200 μm for example on the support 12. To that end it only needs to be placed with its contacts directly on the corresponding contacts 18 of support 12. In this case the electrically conductive connection between the contacts of photodiode 14 and support 12 is extremely short. This assembly of the arrangement according to the invention is useful for example when different materials must be used for the semiconductor circuits of the photodiode 14 on the one hand, and all other semiconductor circuits HS on the other. Thus indium-phosphide can be used for the photodiode 14, while silicon for example can be used for the other semiconductor circuits HS.

It is essential for the arrangement according to the invention that the assembly is a one-piece semiconductor arrangement comprising the support 12 and the expansion 13, which contains as many as possible—in the best of cases all—of the semiconductor circuits HS and circuit elements or components needed or being used for a complete circuit, and which are interconnected in an electrically conductive manner. The semiconductor circuits HS that can be used for a fast data transmission via glass fibers include the semiconductor circuits already mentioned for FIG. 5, as well as laser diodes and monitor diodes. The semiconductor circuit HS on the support 12 can also advantageously include an intelligent electronic component with a memory function, for example the microcontroller 17 already mentioned above. Such a microcontroller 17 can for example control, switch on, terminate and change the course sequences during the data transmission. In that case it can especially access individual semiconductor circuits HS or other circuit elements and electrical components as well.

Figure 7:
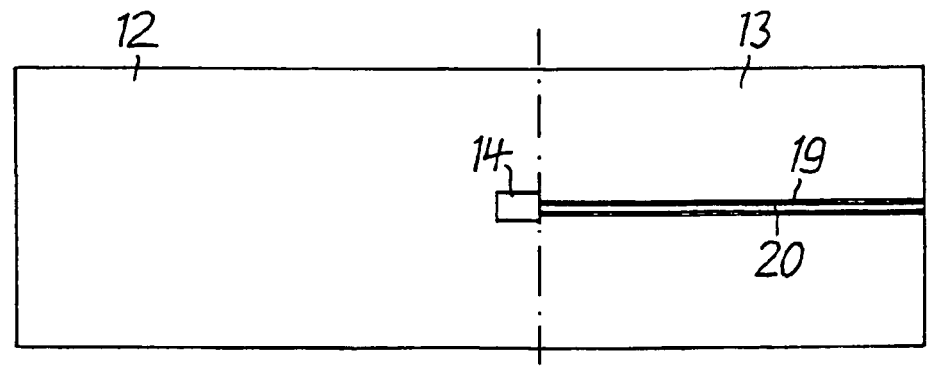
FIG. 7 is a schematically illustrated detail of the arrangement.
Figure 8:
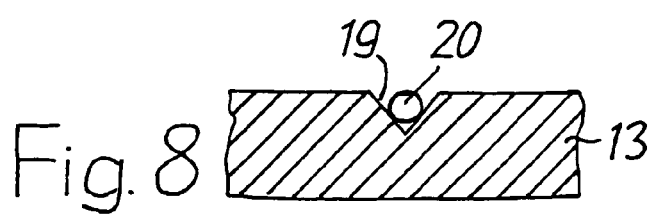
FIG. 8 is a front view of the arrangement in FIG. 7 with an enlarged illustration of a section.

The expansion 13 of support 12 is an additional open surface which already exists as such on the wafer 10 (see FIG. 4). The surface of the expansion 13 can be treated and changed by means of micromechanical processing or structuring, such as etching for example, so that it becomes suitable for receiving the other circuit elements and components that must be used for the data transmission. Thus the expansion 13 can for example contain a V-groove 19 as illustrated in FIGS. 7 and 8 for receiving an optical fiber 20 which is precisely positioned and coupled to the photodiode 14. The V-groove 19 has a depth of 150 µm for example. More than one V-groove 19 can of course be produced in expansion 13. A base for other circuit elements and components can be created on the expansion 13 by suitably structuring same. In this case structuring can mean the removal of material, for example for the V-groove 19, but also the addition of materials. The circuit elements and components, for example, can be temperature sensors, cooling elements, screens, damping and adjusting elements as well as relays, lenses, mirror elements, optical filters, optical insulators and optical amplifiers.

Figure 6:
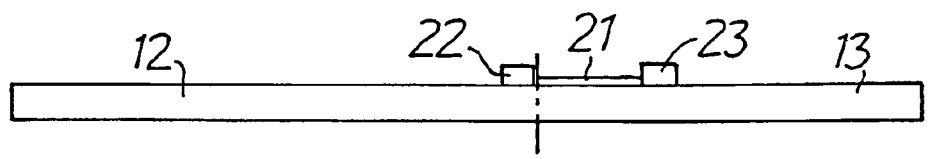
FIG. 6 is a side view of a support that can be used in the arrangement.

As shown in FIG. 6, an optical guide 21 which may be made of glass or a polymer or the semiconductor material of the expansion 13 itself, can be installed on the expansion 13 of support 12. It may be used to optically connect the components located on support 12, for example a laser diode 22 with a modulator or an optical insulator 23. The optical guide 21 can be made for example of silicon dioxide, perhaps in the form of a Low Temperature Oxide (LTO) precipitated by means of Plasma Enhanced Chemical Vapor Deposition (PECVD).

As already mentioned, the microcontroller 17 can be used for example to monitor the flawless operation of a complete circuit installed on a support 12 with an expansion 13, and possibly for the correction of parameters. This also applies for example to the temperature stabilization of the complete circuit by means of temperature sensors and cooling elements. It also applies to maintaining or changing the wavelength during the data transmission by influencing a screen or a mirror. In the same way relays and lenses as well as damping and adjusting elements can be monitored and influenced by the microcontroller 17. The latter can also be used to adjust mirror elements which have a switching function for example, or whereby the path of a light beam that is used for the data transmission can be changed. It then becomes possible for example to switch different optical fibers 20, which are installed on the expansion 13, to a photodiode 14 or to a laser diode.

The preceding essentially describes the arrangement according to the invention for a receiver circuit. In the same sense the invention can also be applied to other circuits, for example to a sender circuit which instead of the photodiode 14 uses a laser diode with a driver circuit and possibly a monitor diode.

The invention claimed is:

1. An arrangement with at least two different electronic semiconductor circuits, where each of the semiconductor circuits is a component made of semiconductor material which comprises an electrically active surface and electrical contacts, and where corresponding contacts of the semiconductor circuits are interconnected in an electrically conductive manner, characterized in that the semiconductor circuits (HS) are produced within a common support (12) made of a homogeneous semiconductor material in a one-piece unit and are interconnected in an electrically conductive manner;

the support (12) is metallized so as to provide electrically conductive contacts (18) on its surface which are connected to the semiconductor circuits (HS) so as to obtain very short connections suitable for semiconductor circuits (HS) that operate at very high frequencies; and the support (12) comprises an expansion (13) for receiving other circuit elements or components; wherein the expansion is made of the same material as the support (12) and forms a one-piece unit with it, and further wherein said expansion (13) contains at least one groove (19) for receiving an optical fiber, and wherein relays, lenses, optical filters and/or mirror elements are installed on the expansion (13).

2. An arrangement as claimed in claim 1, characterized in that the expansion (13) for receiving the circuit elements or components is structured by micromechanical processing.

3. An arrangement as claimed in claim 1, characterized in that one of the semiconductor circuits (HS) is a photodiode (14).

4. An arrangement as claimed in claim 1, characterized in that a photodiode is installed as a separate component on the support (12).

5. An arrangement as claimed in claim 1, characterized in that one of the semiconductor circuits (HS) is a laser diode.

6. An arrangement as claimed in claim 1, characterized in that a laser diode is installed as a separate component on the support (12).

7. An arrangement as claimed in claim 1, characterized in that one of the semiconductor circuits (HS) is an intelligent electronic component with a memory function.

8. An arrangement as claimed in claim 7, characterized in that the electronic component is a microcontroller (17).

9. An arrangement as claimed in claim 1, characterized in that the support (12) comprises other semiconductor circuits (HS), for example optical filters, optical insulators, optical amplifiers and monitor diodes.

10. An arrangement as claimed in claim 1, characterized in that the support is made of a silicon, gallium-arsenide or indium-phosphide semiconductor material.

11. The utilization of an arrangement as claimed in claim 1 for fast data transmission at frequencies above 1 GHz.

12. An arrangement with at least two different electronic semiconductor circuits, where each of the semiconductor circuits is a component made of semiconductor material which comprises an electrically active surface and electrical contacts, and where corresponding contacts of the semiconductor circuits are interconnected in an electrically conductive manner, characterized in that the semiconductor circuits (HS) are produced within a common support (12) made of a homogeneous semiconductor material in a one-piece unit and are interconnected in an electrically conductive manner;

the support (12) is metallized so as to provide electrically conductive contacts (18) on its surface which are connected to the semiconductor circuits (HS) so as to obtain very short connections suitable for semiconductor circuits (HS) that operate at very high frequencies; and the support (12) comprises an expansion (13) for receiving other circuit elements or components; wherein the expansion is made of the same material as the support (12) and forms a one-piece unit with it, and further wherein said expansion (13) contains at least one groove (19) for receiving an optical fiber, wherein relays, lenses, optical filters and/or mirror elements are installed on the expansion (13), and wherein an optical guide (21) which is used as a connector is installed on the expansion (13).

13. An arrangement as claimed in claim 12, characterized in that the optical guide (21) is made of glass.

14. An arrangement as claimed in claim 13, characterized in that the optical guide (21) is made of silicon dioxide.

15. An arrangement as claimed in claim 12, characterized in that the optical guide (21) is made of a polymer.

16. An arrangement as claimed in claim 12, characterized in that the optical guide (21) is made of semiconductor material.

* * * * *